(12) United States Patent
Sekido (10) Patent No.: US 7,649,740 B2
(45) Date of Patent: Jan. 19, 2010

(54) STACKED MOUNTING STRUCTURE

(75) Inventor: Takanori Sekido, Chofu (JP)

(73) Assignee: Olympus Corporation, Tokyo (JP)

( * ) Notice: Subject to any disclaimer, the term of this patent is extended or adjusted under 35 U.S.C. 154(b) by 150 days.

(21) Appl. No.: 12/015,212

(22) Filed: Jan. 16, 2008

(65) Prior Publication Data

US 2008/0170376 A1 Jul. 17, 2008

(30) Foreign Application Priority Data

Jan. 17, 2007 (JP) ............................. 2007-008373

(51) Int. Cl.
*H05K 7/00* (2006.01)

(52) U.S. Cl. ...................................... 361/735; 361/790

(58) Field of Classification Search ................. 361/790, 361/735, 301.4, 742, 758, 770, 804; 257/666, 257/676, 686; 439/76.1
See application file for complete search history.

(56) References Cited

U.S. PATENT DOCUMENTS

| 5,491,304 | A | * | 2/1996 | Kei Lau et al. | .............. | 174/264 |
| 6,038,140 | A | * | 3/2000 | Petri | .......................... | 361/804 |
| 6,940,175 | B2 | * | 9/2005 | Iwazaki et al. | .............. | 257/777 |
| 7,184,276 | B2 | * | 2/2007 | Hashimoto | .................. | 361/803 |
| 7,550,836 | B2 | * | 6/2009 | Chou et al. | ................. | 257/686 |
| 2009/0168386 | A1 | * | 7/2009 | Suzuki et al. | ............... | 361/810 |

FOREIGN PATENT DOCUMENTS

| JP | HEI 4-038417 | 3/1986 |
| JP | HEI 11-111914 | 4/1999 |

OTHER PUBLICATIONS

English-language abstract only of Japanese Patent Laid-Open Publication No. Sho 61-059309 laid-open on Mar. 26, 1986.

* cited by examiner

*Primary Examiner*—Hung S Bui
(74) *Attorney, Agent, or Firm*—Scully, Scott, Murphy & Presser, P.C.

(57) ABSTRACT

In a stacked mounting structure At least a pair of a first connecting terminal and a second connecting terminal is formed, and further, the stacked mounting structure includes a protruding electrode which is provided on at least any one of the first connecting terminal and the second connecting terminal, and an electroconductive paste which is formed on a side surface of an intermediate substrate, and which electrically connects the first connecting terminal and the second connecting terminal. The first connecting terminal and the second connecting terminal are exposed by a recess in a surface of the intermediate substrate. The first connecting terminal and the second connecting terminal are electrically connected via the protruding electrode and the electroconductive paste in the recess which is provided in the intermediate substrate.

7 Claims, 9 Drawing Sheets

STACKED MOUNTING STRUCTURE

CROSS-REFERENCE TO RELATED APPLICATION

The present application is based upon and claims the benefit of priority from the prior Japanese Patent Application No. 2007-008373 filed on Jan. 17, 2007, the entire contents of which are incorporated herein by reference.

BACKGROUND OF THE INVENTION

1. Field of the Invention

The present invention relates to a stacked mounting structure, and particularly to a three-dimensional stacked mounting structure which is made by stacking a plurality of members in a direction of thickness of the members.

2. Description of the Related Art

Figure 8:
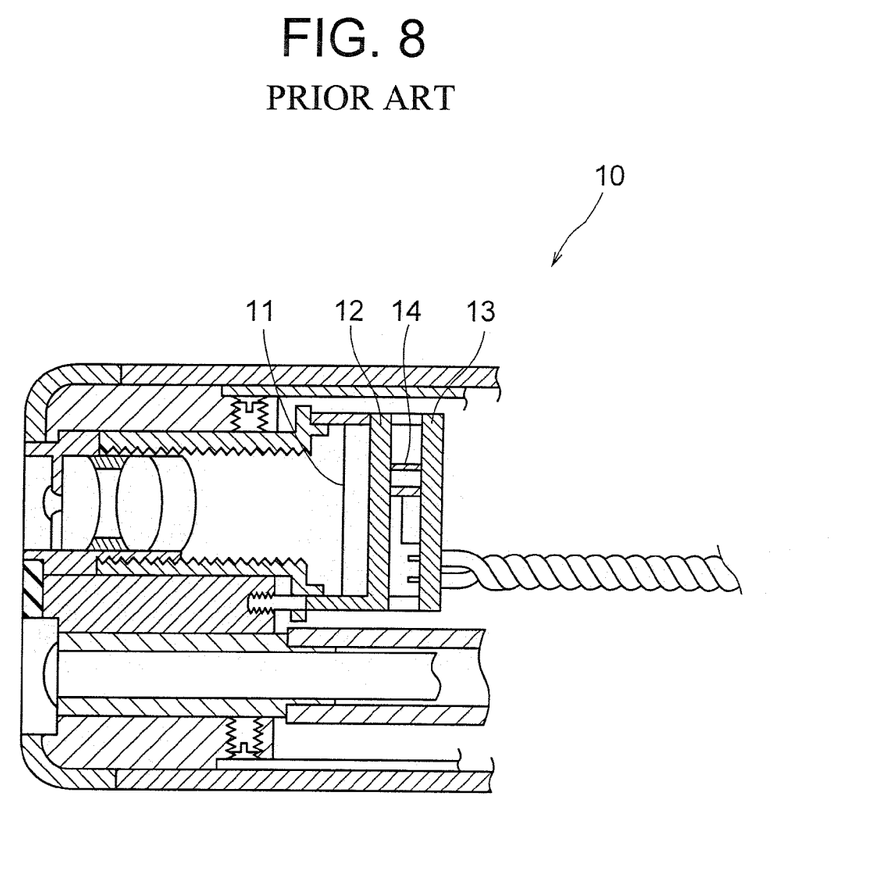
FIG. 8 is a diagram showing a cross-sectional view of a stacked mounting structure according to a conventional technology.

Regarding a structure which includes a substrate on which electronic components are mounted, various structures have hitherto been proposed (refer to Japanese Patent Application koukoku (post-exam. publn.) No. Hei 4-38417 and Japanese Patent Application Laid-open Publication No. Hei 11-111914 for example). In Japanese Patent Application koukoku (post-exam. publn.) No. Hei 4-38417, for example, as shown in FIG. 8, a mounted structure related to an image pickup unit which is provided at a front-end portion of an endoscope 10 has been disclosed. Here, a technology of stacking a mounting substrate parallel to an image pickup element 11 has been described. In this technology, first of all, a mounting substrate 12 is disposed parallel to the image pickup element 11. Next, the mounting substrate 12 on which the image pickup element 11 is mounted, and a mounting substrate 13 on which the other components are mounted are mounted via a spacer. Accordingly, mounting components on the mounting substrate can be disposed in a space which is secured by a portion of a height of the spacer. Consequently, it is possible to improve a mounting density of the mounting structure. As a result of this, it is possible to facilitate making small a size of the image pickup unit which is provided at the front-end portion of the endoscope.

Figure 9:
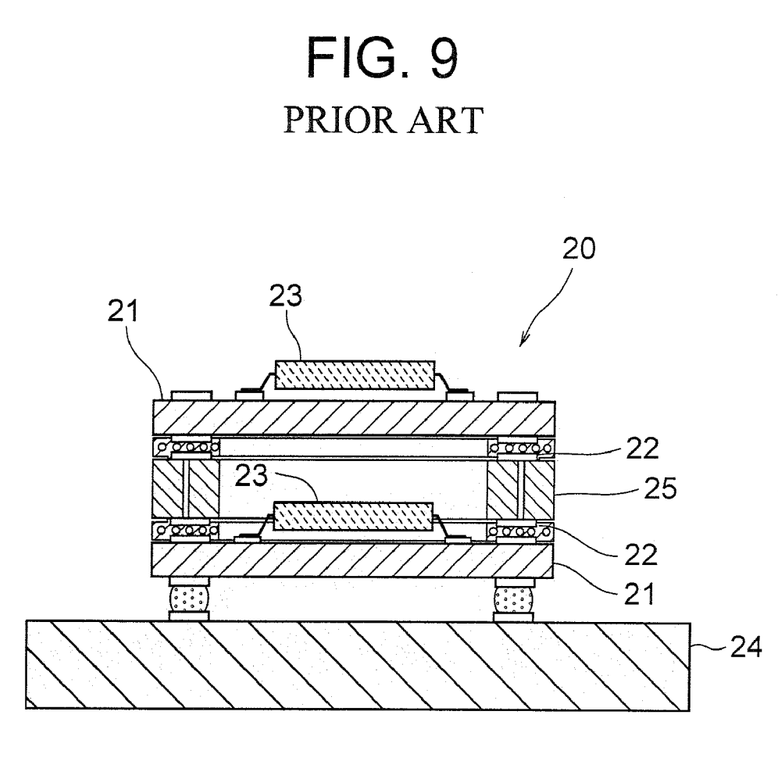
FIG. 9 is a diagram showing a cross-sectional view of another stacked mounting structure according to the conventional technology.

Moreover, in Japanese Patent Application Laid-open Publication No. Hei 11-111914, as shown in FIG. 9, a structure of a mounting structure 20 which includes a memory module substrate 24 has been disclosed. An inner side of substrates 21 facing is hollow. A plurality of electrodes is provided on both surfaces of the substrate 21. Moreover, an electrode on a front surface of the substrate 21 and an electrode on a rear surface of the substrate 21 facing are mutually connected electrically. At a connecting portion of the electrodes, an anisotropic electroconductive film 22 is attached. In this manner, in Japanese Patent Application Laid-open Publication No. Hei 11-111914, a mounting structure of the substrate 21 on which an electronic component 23 is mounted has been disclosed. In this structure, for joining an electroconductive spacer 25 and the anisotropic electroconductive film 22, an electrode is provided in a through hole which is provided in the electroconductive spacer 25.

In the structure disclosed in Japanese Patent Application koukoku (post-exam. publn.) No. Hei 4-38417, an electrical conduction between substrates disposed by stacking is secured by a lead wire 14. An automation of a job of joining the substrates by the lead wire 14 is difficult. For example, in a small structure, a job of disposing short lead wires and soldering cannot be dealt with by a normal automatic mounting machine. Therefore, the job of fixing the lead wire 14 has to be carried out manually. Moreover, even by the manual job, such a mounting is a job in a category of a high degree of difficulty. A technology in which the automation is difficult and the degree of difficulty of the job is high, leads to an increase in a mounting cost and a decline in productivity. Moreover, when a size of the lead wire which can be handled manually, and a controllable gap between the lead wires at the time of handling are taken into consideration, the structure according to the conventional technology is disadvantageous for making small the mounting structure.

Moreover, in the structure disclosed in Japanese Patent Application Laid-open Publication No. Hei 11-111914, as it is evident from FIG. 9, it is necessary to provide an electrode of an area larger than an outer shape of the through hole, on the electroconductive spacer 25. Therefore, narrowing of a pitch of joining portions becomes difficult. In other words, it is difficult to make small a projected area when the mounting structure is viewed from a top. Moreover, in this structure, the anisotropic electroconductive film 22 is used as a material joining the electroconductive spacer 25 and the substrate 21. Therefore, there is a drawback that a resistance of connection between the electroconductive spacer 25 and the substrate 21 becomes high.

In this manner, in a case of the mounting structure of the conventional technology, it is difficult to secure a favorable productivity in making a stacked mounting of substrates via a spacer for securing a mounting space for electronic components. Moreover, it is also difficult to make the size small to reduce a projected area in a direction of a plane of a substrate.

SUMMARY OF THE INVENTION

The present invention is made upon taking into consideration the abovementioned issues, and an object of the present invention is to provide a stacked mounting structure having a plurality of substrates connected via a spacer, and mounting components mounted in a space between the substrates, in which, an improvement in the yield, a reduction of cost, and a shortening of a manufacturing time are realized by reducing manufacturing steps, and lowering a resistance of connections, while making a size small by decreasing a projected area in a direction of plane of the substrate.

To solve the issues mentioned above, and to achieve the object, according to the present invention, there can be provided a stacked mounting structure which includes at least two members namely a first member on which, components to be mounted are mounted, and a second member which is disposed facing the first member, and on which, other components to be mounted are mounted, and an intermediate member which is disposed between the first member and the second member, and which connects the first member and the second member by leaving a predetermined gap between the first member and the second member, and which has a space which accommodates therein the components to be mounted, and at least a pair of a first electrode and a second electrode is formed on the first member and the second member, and the stacked mounting structure further includes a protruding electrode which is provided on at least any one of the first electrode and the second electrode, and an electroconductive portion which is formed on a surface of the intermediate member orthogonal to a surface on which the first electrode or the second electrode is formed, and which electrically connects the first electrode and the second electrode.

The first electrode of the first member and the second electrode of the second member are exposed by forming a recess on the surface of the intermediate member orthogonal to the surface on which the first electrode or the second electrode is formed, and the first electrode and the second electrode are electrically connected via the protruding electrode and the electroconductive portion inside the recess which is provided in the intermediate member.

Moreover, according to a preferable aspect of the present invention, it is desirable that a first protruding electrode is formed on the first electrode and a second protruding electrode is formed on the second electrode.

Moreover, according to a preferable aspect of the present invention, it is desirable that the protruding electrode is formed by stacking.

Moreover, according to a preferable aspect of the present invention, it is desirable that a shape of the protruding electrode is a shape in which, a front-end portion is the thinnest.

DETAILED DESCRIPTION OF THE INVENTION

Exemplary embodiments of a stacked mounting structure according to the present invention will be described below in detail by referring to the accompanying diagrams. However, the present invention is not restricted to the embodiments described below.

FIRST EMBODIMENT

Figure 1:
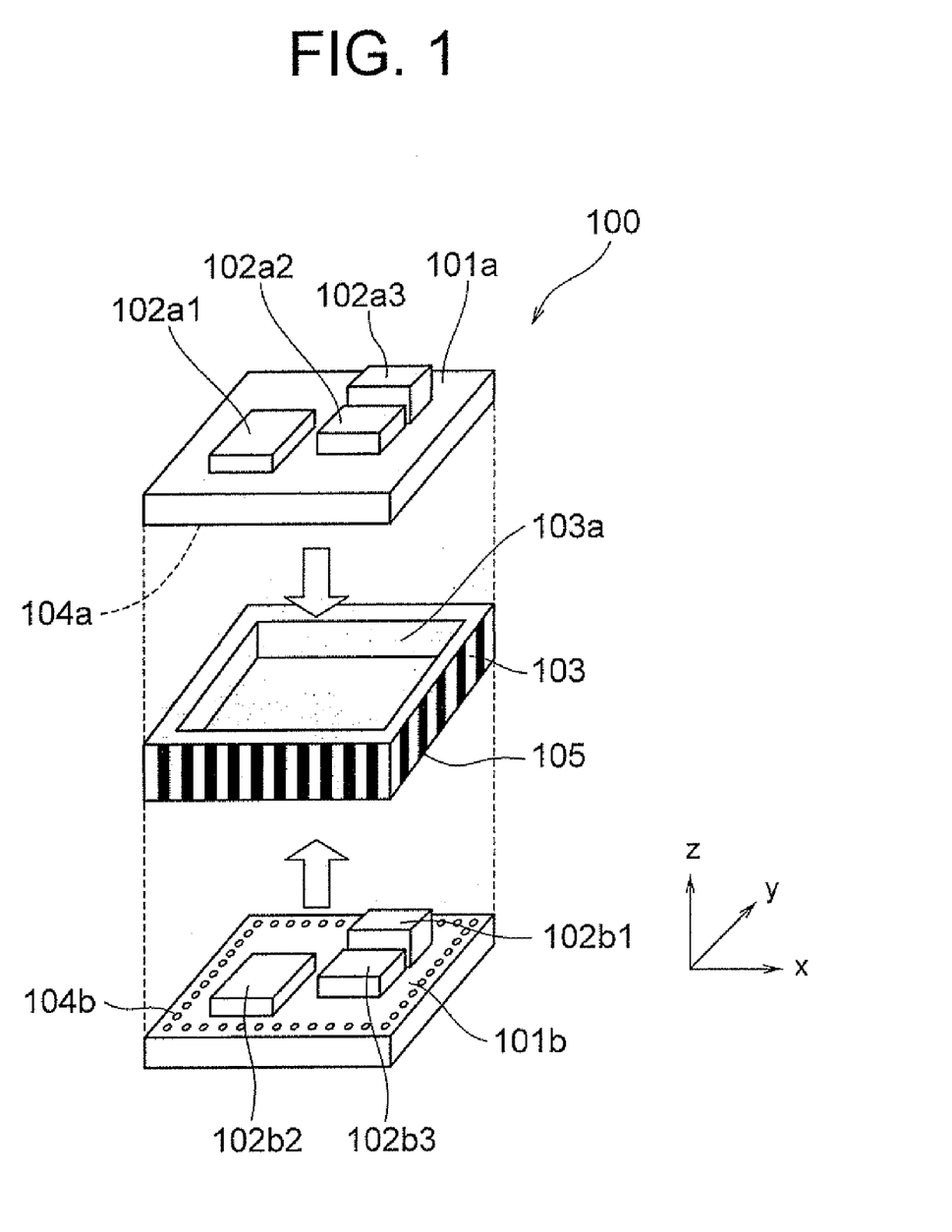
FIG. 1 is a diagram showing an exploded perspective view of a stacked mounting structure according to a first embodiment of the present invention.

FIG. 1 is an exploded perspective view of a stacked mounting structure 100 according to a first embodiment of the present invention. Various devices 102a1, 102a2, and 102a3 (hereinafter called as "devices 102a1 etc.") which are electronic components including active components and passive components are mounted on a first substrate 101a. Moreover, various other devices 102b1, 102b2, and 102b3 (hereinafter called as "devices 102b1 etc.") which are electronic components including active components and passive components are mounted on a second substrate 101b. The first substrate 101a and the second substrate 101b are disposed to be facing mutually. The first substrate 101a corresponds to a first member. The second substrate 101b corresponds to a second member. The devices 101a1 etc. and 101b1 etc. correspond to components to be mounted.

Each of the first substrate 101a, the second substrate 101b, and an intermediate substrate 103 which will be described later, is formed of (a material such as) an organic substrate, a ceramic substrate, and a glass substrate. Moreover, the first substrate 101a, the second substrate 101b, and the intermediate substrate 103 may be a composite substrate in which the respective substrates are combined.

Moreover, at least a pair of a first connecting terminal 104a and a second connecting terminal 104b is formed on the first substrate 101a and the second substrate 101b. The first connecting terminal 104a corresponds to a first electrode. The second connecting terminal 104b corresponds to a second electrode.

The first connecting terminal (not shown in FIG. 1) which is provided on the first substrate 101a is electrically connected to various devices 102a1 etc. mounted on the first substrate 101a. Moreover, the first connecting terminal 104a also has a function of connecting electrically the devices 102a1 etc. and the second substrate 101b.

Similarly, the second connecting terminal 104b which is provided on the second substrate 101b is electrically connected to various devices 102b1 etc. which are electronic components mounted on the second substrate 101b. Moreover, the second connecting terminal 104b also has a function of connecting electrically the devices 102b1 etc. and the first substrate 101a.

The intermediate substrate 103 is disposed between the first substrate 101a and the second substrate 101b. The intermediate substrate 103 connects the first substrate 101a and the second substrate 101b leaving a predetermined gap between the first substrate 101a and the second substrate 101b, and has an aperture accommodating portion 103a which is a space accommodating therein the devices 102b1 etc. which are components to be mounted.

In the following description, for the sake of convenience, a surface of the intermediate substrate 103 orthogonal to a surface on which the first connecting terminal 104a or the second connecting terminal 104b is formed is called as 'a side surface of the intermediate substrate 103'.

The aperture accommodating portion 103a is formed in a direction perpendicular to a side-surface direction of the intermediate substrate 103 by a method such as a drilling, a punching, a laser processing, an etching, and a die forming. Further, the structure is such that a height of the intermediate substrate 103 is same or more than a height of various devices 102b1 etc. mounted on the second substrate 101b.

Figure 2:
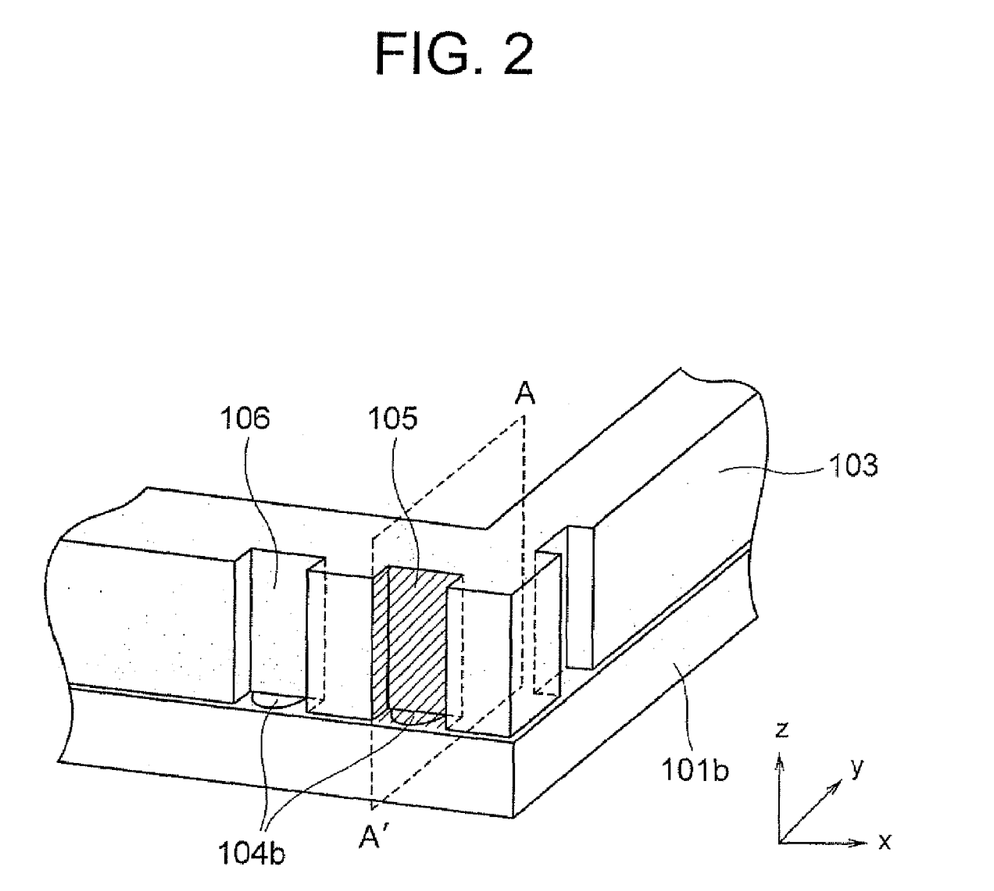
FIG. 2 is a diagram showing a perspective view of the stacked mounting structure according to the first embodiment of the present invention.

As shown in FIG. 2, a recess 106 (groove) is formed in the side surface of the intermediate substrate 103. Accordingly, the structure is such that the first connecting terminal 104a of the first substrate 101a and the second connecting terminal 104b of the second substrate 101b are exposed. The recess 106, as shown in FIG. 1, is formed spreading over a periphery of the intermediate substrate 103. Moreover, the recess 106 is formed continuously with a constant depth.

According to the first embodiment, the recess 106 is formed in at least a part of the side surface of the intermediate substrate 103. Therefore, a part of the first connecting terminal 104a and the second connecting terminal 104b respectively are exposed in a direction of a principal plane of the respective substrate. Accordingly, it is possible to increase a joining area of the connecting terminal of the first substrate 101a and the intermediate substrate 103, and a joining area of the connecting terminal of the second substrate 101b and the intermediate substrate 103.

Figure 3A:
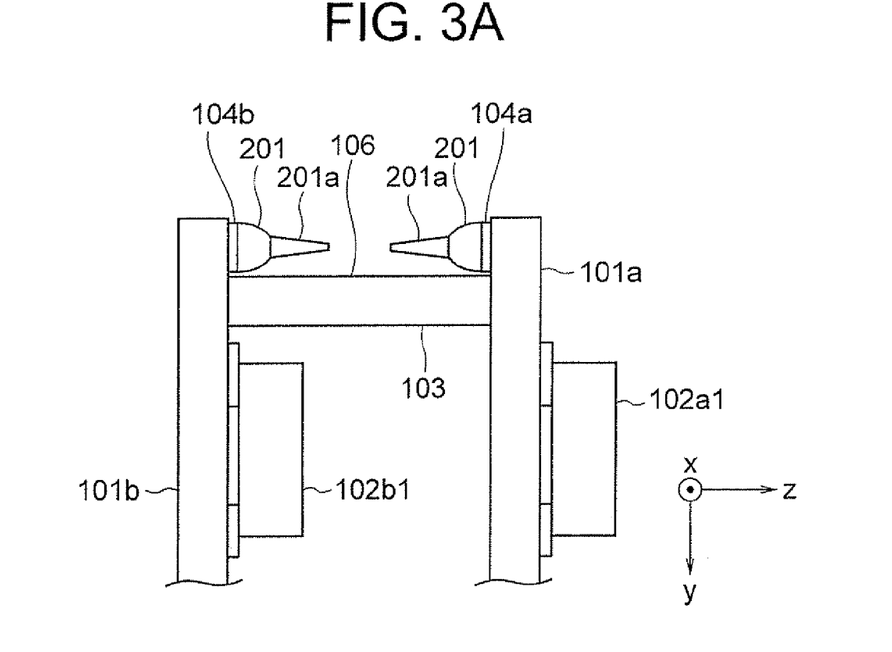
FIG. 3A and FIG. 3B are diagrams showing cross-sectional views of the stacked mounting structure according to the first embodiment of the present invention.
Figure 3B:
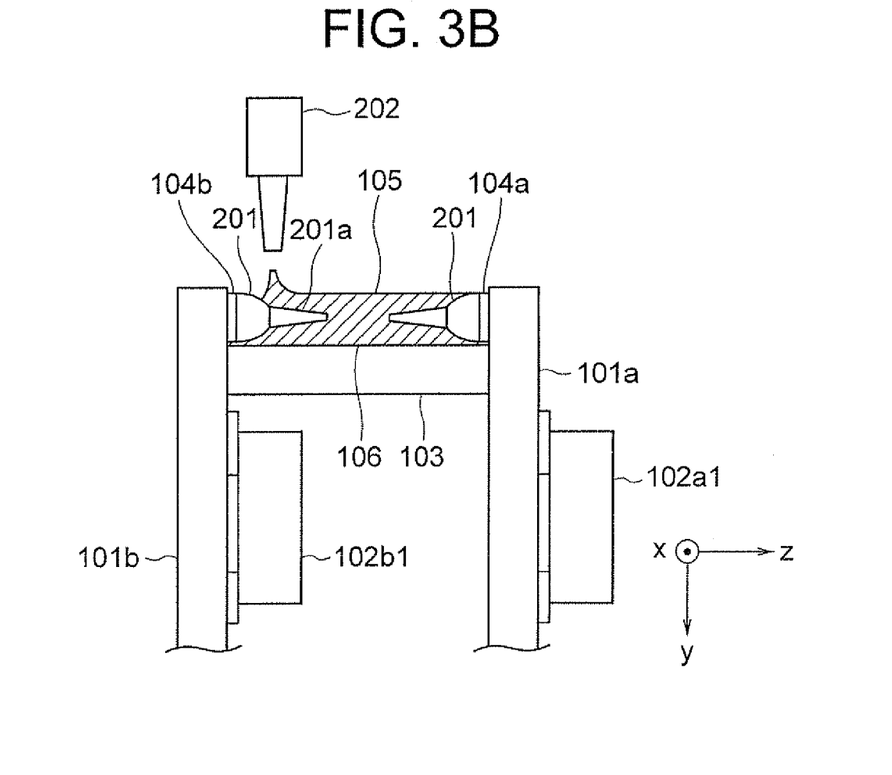
Figure 4:
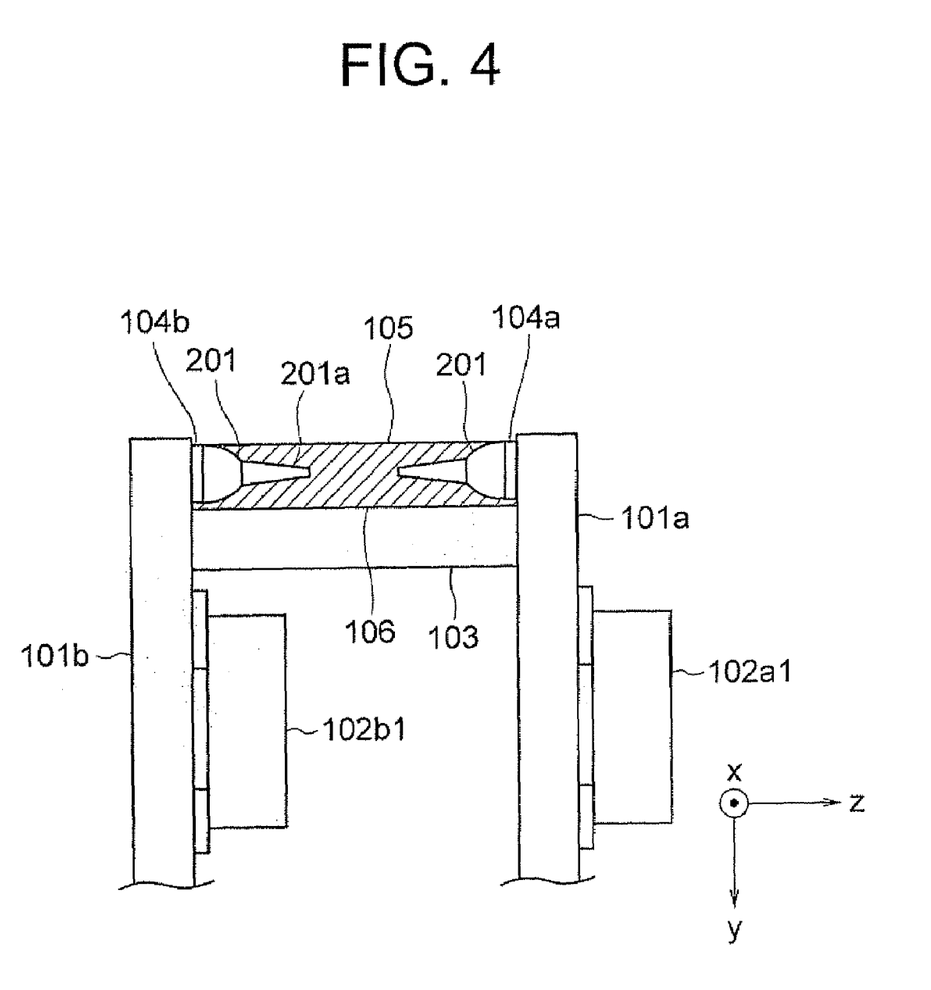
FIG. 4 is another diagram showing a cross-sectional view of the stacked mounting structure according to the first embodiment of the present invention.

The description will be continued further by using a cross-sectional structure of a plane A-A'. FIG. 3A, FIG. 3B, and FIG. 4 show a structure of a cross-section A-A'. As shown in FIG. 3A, a protruding electrode 201 is formed on each of the first connecting terminal 104a and the second connecting terminal 104b, to be facing mutually.

Moreover, the recess 106 is formed at a position where the first connecting terminal 104a and the second connecting terminal 104b are facing. In this manner, when viewed from a direction of mounting, the first connecting terminal 104a, the second connecting terminal 104b, and the recess 106 are disposed to be the same projected surface.

Next, as shown in FIG. 3B, an electroconductive paste 105 is supplied by an electroconductive paste supplying section 202 to the recess 106 which is formed in the side surface of the intermediate substrate 103. Accordingly, a wire can be formed between the first connecting terminal 104a and the second connecting terminal 104b.

Figure 5:
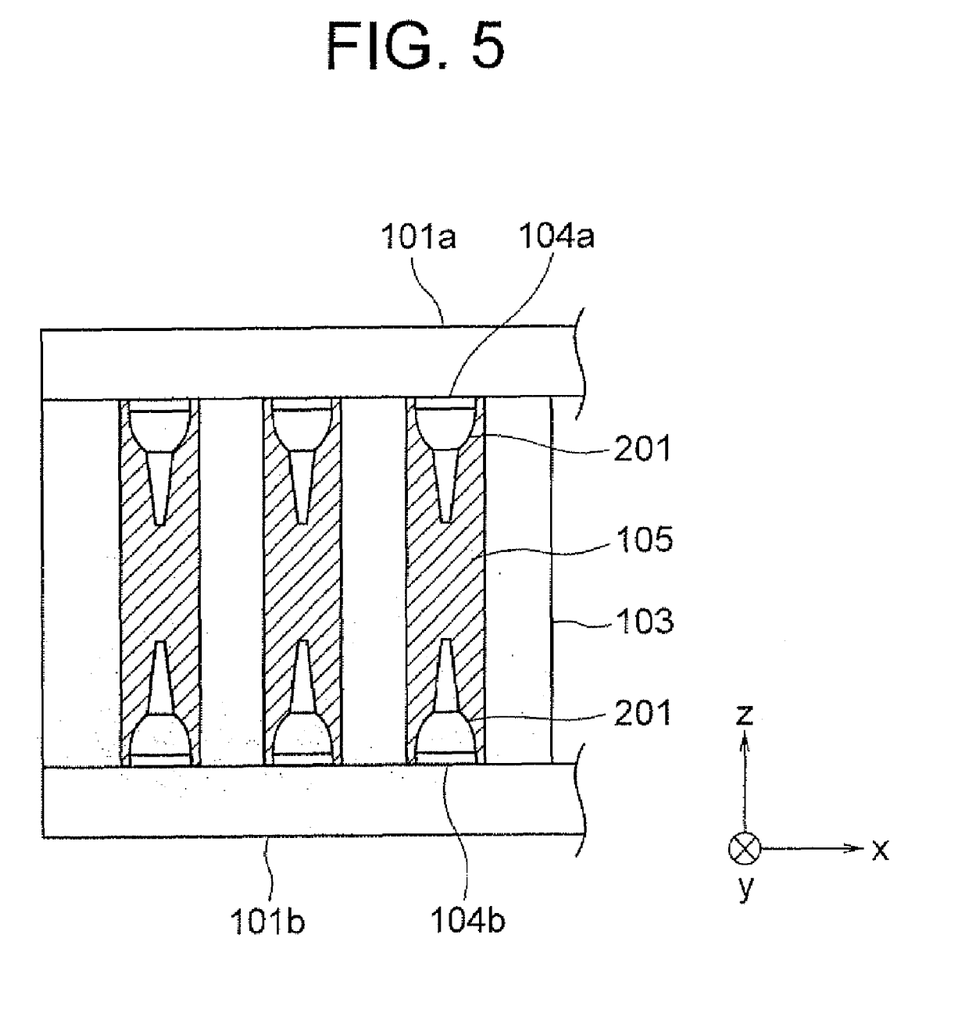
FIG. 5 is a diagram showing a side view of the stacked mounting structure according to the first embodiment of the present invention.

As a result, as shown in FIG. 4, the first substrate 101a and the second substrate 101b can be connected electrically. The protruding electrodes 201 are connected by the electroconductive paste 105. The electroconductive paste 105 corresponds to an electroconductive section. Moreover, FIG. 5 shows a structure of a side surface of the intermediate substrate 103 when viewed from a y direction.

Here, the first connecting terminal 104a and the second connecting terminal 104b are formed by plating. A material for the plating may be an electroconductive material such as Au, Cu, and Ag.

Moreover, the protruding electrodes 201 are stud bumps made of Au. The protruding electrodes 201 can also be formed by printed bumps or plated bumps of an electroconductive material. A shape of the protruding electrodes 201 is a shape in which a front-end portion 201a is the thinnest.

As it has been described above, the first substrate 101a and the second substrate 101b are disposed to be facing mutually. The first connecting terminal 104a and the second connecting terminal 104b a are disposed at positions completely overlapping in a projected area viewed from the direction of mounting, with respect to the recess 106 (groove) provided in the intermediate substrate 103.

However, without restricting to this, the first connecting terminal 104a and the second connecting terminal 104b may be disposed at positions partially overlapping in the projected area viewed from the direction of mounting, with respect to the recess 106 (groove) provided in the intermediate substrate 103.

A shape of the first connecting terminal 104a and the second connecting terminal 104b may be a rectangular shape with one side of the rectangle of 140 µm. However, without restricting to the rectangular shape, the shape of the first connecting terminal 104a and the second connecting terminal 104b may be an arbitrary shape. Moreover, the protruding electrodes 201 provided on the first connecting terminal 104a and the second connecting electrode 104b are disposed at positions partially or completely overlapping in a projected area viewed from the direction of mounting, with respect to the recess 106 (groove) provided in the intermediate substrate 103. Furthermore, a diameter of the protruding electrode 201 is φ 80 µm for example. The diameter of the protruding electrode 201 may be not more than a dimension (width and depth) of the recess 106.

Furthermore, the electroconductive paste 105 is disposed in a space surrounded by the first substrate 101a, the second substrate 101b, the first connecting terminal 104a, the second connecting terminal 104b, the protruding electrode 201, and the intermediate substrate 103.

The electroconductive paste 105 is a paste containing Ag particles (particle diameter in a range of 50 nm to 5000 nm) and Ag nano particles (particle diameter in a range of 5 nm to 20 nm) for example. Each of the first substrate 101a, the intermediate substrate 103, and the second substrate 101b is fixed by a material such as an adhesive.

Accordingly, the first connecting terminal 104a and the second connecting terminal 104b are electrically connected via the electroconductive paste 105 inside the recess 106 provided in the intermediate substrate 103, and the protruding electrodes 201.

In the first embodiment, even when the electroconductive paste 105 is not in contact with the first connecting terminal 104a and the second connecting terminal 104b, it is possible to secure the electrical connection of the electroconductive paste 105, and the first connecting terminal 104a and the second connecting terminal 104b over even wider range, via the protruding electrodes 201. Due to this, a control of an amount of the electroconductive paste 105 to be supplied becomes easy. Therefore, it is possible to widen further a designing range, and the manufacturing becomes easy.

Moreover, even when there is a dimension change which has occurred at the time of heat hardening of the electroconductive paste 105, it is possible to prevent an occurrence of an electrical-connection defect over even wider range. In such manner, according to the first embodiment, even when there is an error in a direction in which the electroconductive paste 105 formed in the recess 106 becomes small, the error can be counterbalanced in a range of the amount of height. Therefore, it is possible to make the electrical connections assuredly. As a result, it is possible to achieve a stacked mounting structure which is not affected easily by a shape error of the electroconductive paste 105 inside the recess 106.

Moreover, according to the first embodiment, it is possible to increase a joining area of connecting terminal of the first substrate 101a and the electroconductive paste 105, and a joining area of the connecting terminal of the second substrate 101b and the electroconductive paste 105. Therefore, it is possible to reduce a resistance of connections. Consequently, it is possible to provide a stacked mounting structure in which, a quality of electrical connections is improved.

Furthermore, it is possible to provide a stacked mounting structure which is safe with respect to an electrical short-circuit. This is effective particularly when the stacked mounting structure is made small sized, and a pitch of the electroconductive paste 105 of the intermediate substrate 103 is narrowed.

Moreover, it is possible to accommodate the electroconductive paste 105 formed on the side surface of the intermediate substrate 103 inside a projected image (projected area) when viewed from a top of the first substrate 101a and the second substrate 101b.

SECOND EMBODIMENT

Figure 6:
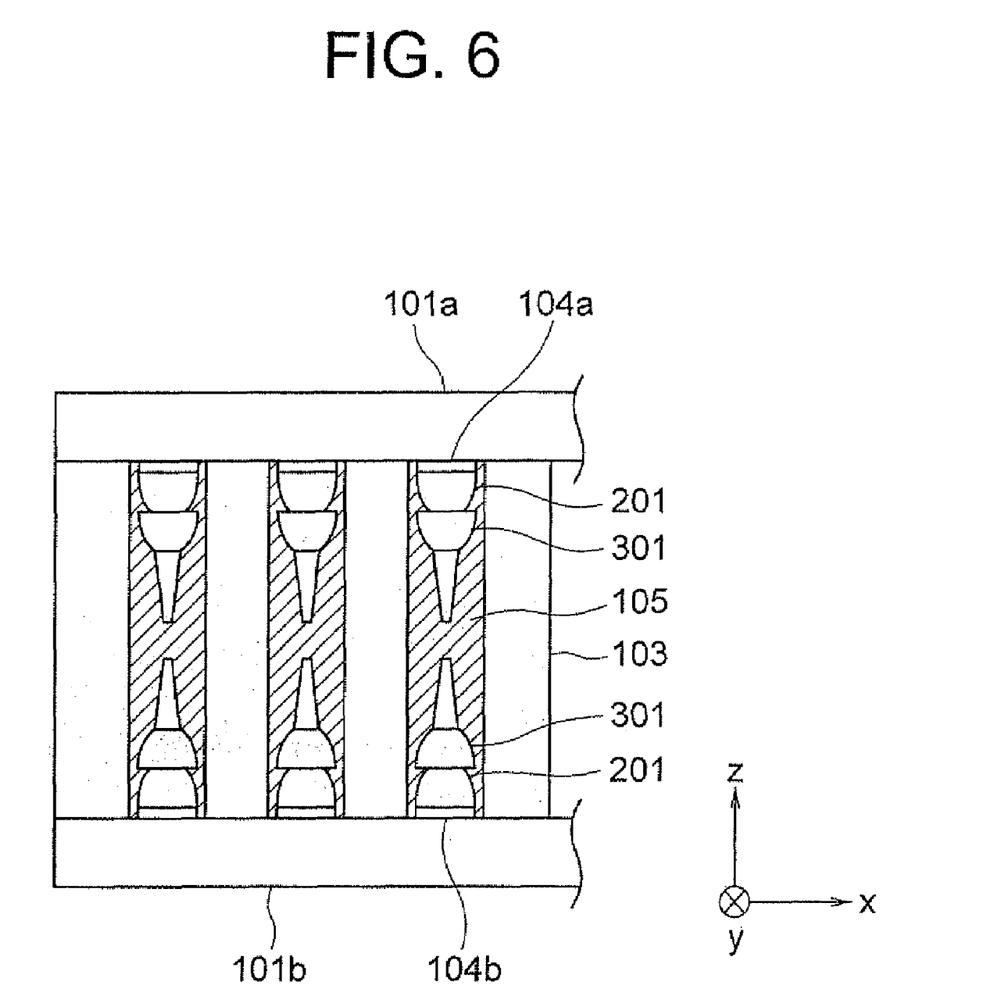
FIG. 6 is a diagram showing a side view of a stacked mounting structure according to a second embodiment of the present invention.
Figure 7:
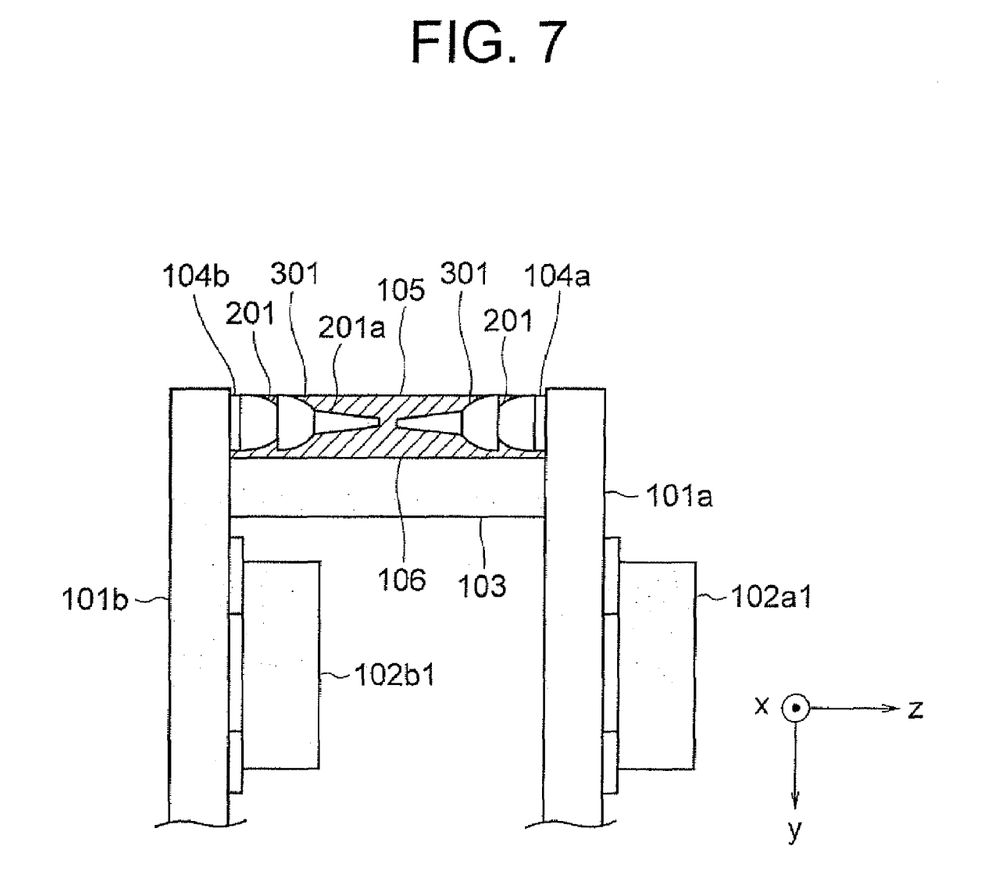
FIG. 7 is a diagram showing a cross-sectional view of the stacked mounting structure according to the second embodiment of the present invention.

Next, a stacked mounting structure according to a second embodiment of the present invention will be described below. Same reference numerals are assigned to components which are same as in the first embodiment, and the description to be repeated is omitted. FIG. 6 is a side view of the stacked mounting structure of the second embodiment when viewed from a y direction. FIG. 7 is a view of an A-A' cross-section similarly as shown in FIG. 6.

In the second embodiment, the protruding electrode 201 is formed by stacking a protruding electrode 301. Moreover, a shape of the protruding electrode 301 is a shape in which a front-end portion is the thinnest.

In the second embodiment, even when an amount supplied of the electroconductive paste is small due to a variation in the amount of the electroconductive paste 105 supplied, as compared to a single-stage protruding electrode 201, it is possible to prevent the occurrence of the electrical-connection defect over even wider range.

Moreover, even when there is a dimension change which has occurred at the time of heat hardening of the electroconductive paste 105, it is possible to prevent the occurrence of the electrical-connection defect over even wider range. Furthermore, by multistaging by stacking the protruding electrode 201, it makes a contact with the electroconductive paste 105 over even wider surface area of the protruding electrode. Therefore, the quality of the electrical connection is further improved and stabilized.

In the first embodiment and the second embodiment described above, the two mutually facing protruding electrodes 201 are used. However, without restricting to such structure, the structure may be such that a protruding electrode is formed on at least one of the first connecting terminal 104a and the second connecting terminal 104b. Moreover, in a case of stacking the protruding electrode 201, it is not restricted to two stages. It is possible to show the abovementioned effect by stacking the protruding electrode 201 in more than two stages.

In such manner, according to the present invention, it is possible to achieve a stacked mounting structure which is easy to manufacture, and small in size, and which has assured electrical connections, and improved and stabilized quality. The present invention can have various modified embodiments which fairly fall within the basic teaching herein set forth.

As it has been described above, the stacked mounting structure according to the present invention is capable of joining assuredly the terminals, and is useful for a small-size mounting structure.

According to the present invention, there is shown an effect that it is possible to provide a stacked mounting structure having a plurality of substrates connected via a spacer, and mounting components mounted in a space between the substrates, in which, an improvement in the yield, a reduction of cost, and a shortening of a manufacturing time are realized by reducing manufacturing steps, and lowering a resistance of connections while making a size small by decreasing a projected area in a direction of plane of the substrate.

What is claimed is:

1. A stacked mounting structure comprising:
   at least two members namely a first member on which, components to be mounted are mounted, and a second member which is disposed facing the first member, and on which, other components to be mounted are mounted; and
   an intermediate member which is disposed between the first member and the second member, and which connects the first member and the second member by leaving a predetermined gap between the first member and the second member, and which has a space which accommodates therein the components to be mounted, wherein
   at least a pair of a first electrode and a second electrode is formed on the first member and the second member, and
   the stacked mounting structure further comprising:
   a protruding electrode which is provided on at least any one of the first electrode and the second electrode; and
   a first protruding electrode is formed on the first electrode, and a second protruding electrode is formed on the second electrode,
   an electroconductive portion which is formed on a surface of the intermediate member orthogonal to a surface on which the first electrode or the second electrode is formed, and which electrically connects the first electrode and the second electrode, wherein
   the first electrode of the first member and the second electrode of the second member are exposed by forming a recess on the surface of the intermediate member orthogonal to the surface on which the first electrode or the second electrode is formed, and
   the first electrode and the second electrode are electrically connected via the protruding electrode and the electroconductive portion inside the recess which is provided in the intermediate member.

2. The stacked mounting structure according to claim 1, wherein the protruding electrode is formed by stacking.

3. The stacked mounting structure according to claim 2, wherein a shape of the protruding electrode is a shape in which, a front-end portion is the thinnest.

4. The stacked mounting structure according to claim 1, wherein a shape of the protruding electrode is a shape in which, a front-end portion is the thinnest.

5. The stacked mounting structure according to claim 1, wherein the protruding electrode is formed by stacking.

6. The stacked mounting structure according to claim 5, wherein a shape of the protruding electrode is a shape in which, a front-end portion is the thinnest.

7. The stacked mounting structure according to claim 1, wherein a shape of the protruding electrode is a shape in which, a front-end portion is the thinnest.

* * * * *